United States Patent
Moran

(10) Patent No.: US 7,225,280 B2
(45) Date of Patent: May 29, 2007

(54) PORTABLE DEVICE FOR ONE-ON-ONE TRANSFER BETWEEN ANOTHER SUCH DEVICE WHEREIN DEVICE IS RESTRICTED TO DATA STORAGE AND TRANSFER WITH SINGLE INTERFACE FOR DATA EXCHANGE

(75) Inventor: Dov Moran, Kfar Saba (IL)

(73) Assignee: SanDisk IL Ltd., Kfar Saba (IL)

( * ) Notice: Subject to any disclaimer, the term of this patent is extended or adjusted under 35 U.S.C. 154(b) by 333 days.

(21) Appl. No.: 10/084,226

(22) Filed: Feb. 28, 2002

(65) Prior Publication Data

US 2003/0163622 A1    Aug. 28, 2003

(51) Int. Cl.
G06F 3/00       (2006.01)
G06F 17/00      (2006.01)
H04B 7/00       (2006.01)

(52) U.S. Cl. ............................ 710/74; 710/12; 710/31; 710/33; 710/38; 710/62; 710/103; 710/100; 710/111; 463/39; 455/41.2; 455/404.2; 455/88; 455/418

(58) Field of Classification Search .............. 710/12, 710/31, 33, 38, 62, 103, 100, 1.5, 111, 74; 463/39; 455/88, 41.2, 418, 404.2
See application file for complete search history.

(56) References Cited

U.S. PATENT DOCUMENTS

| | | | | |
|---|---|---|---|---|
| 5,797,085 | A  * | 8/1998 | Beuk et al. | 455/88 |
| 6,405,278 | B1 * | 6/2002 | Liepe | 711/103 |
| 6,524,189 | B1 * | 2/2003 | Rautila | 463/40 |
| 6,563,494 | B1 * | 5/2003 | Eichstaedt et al. | 345/179 |
| 6,595,858 | B1 * | 7/2003 | Tajiri et al. | 463/31 |
| 6,606,566 | B1 * | 8/2003 | Sunshine | 702/22 |
| 6,799,035 | B1 * | 9/2004 | Cousins | 455/418 |
| 6,879,810 | B2 * | 4/2005 | Bouet | 455/41.2 |
| 2003/0027634 | A1 * | 2/2003 | Matthews, III | 463/39 |
| 2003/0041206 | A1 * | 2/2003 | Dickie | 710/303 |
| 2003/0056131 | A1 * | 3/2003 | Eberhard et al. | 713/320 |

* cited by examiner

Primary Examiner—Tammara Peyton
(74) Attorney, Agent, or Firm—Mark M. Friedman

(57) ABSTRACT

A device, a method and a system for portable data storage and transfer through a simplified device interface. The operations of the device are restricted, in order to increase the ease of use of the device, and in order to provide certain core functions. These core functions include reading data, writing data and exchanging data with a similar device and/or with an external computer. The device features a minimal set of hardware components for accomplishing these functions, such as a data processor of some type, a memory storage medium or media, and a data exchange mechanism, which may optionally be an infrared port for example.

14 Claims, 4 Drawing Sheets

PORTABLE DEVICE FOR ONE-ON-ONE TRANSFER BETWEEN ANOTHER SUCH DEVICE WHEREIN DEVICE IS RESTRICTED TO DATA STORAGE AND TRANSFER WITH SINGLE INTERFACE FOR DATA EXCHANGE

FIELD OF THE INVENTION

The present invention relates to a device, system and method for data storage with the unique capability of exchanging data with another such device without any intervention of, with or through a computer, and in particular, for such a device, system and method in which data exchange is performed with a highly simplified device interface.

BACKGROUND OF THE INVENTION

Portable electronic devices for data storage are useful for data access and transfer, particularly outside of a desktop computer environment. Such devices enable the user to keep data at hand, rather than forcing the user to access such data from the memory or data storage of a single stationary computer. Currently, portable data storage is performed either with an electronic device that attempts to maintain all functions of the desktop computer, such as a Palm computing device for example, or with completely passive data storage devices, such as a floppy disk for example.

Both of these different types of portable data storage media suffer from drawbacks. A handheld computer/organizer has the advantage of being able to read, write, manipulate and display data, in addition to being able to store the data. However, as a smaller, more portable version of a desktop computer, the handheld computer is also relatively complex and more expensive. Organizers are not built to store large computer files. Even if they have this capability, they do not have a provision to exchange files, but only very specific information, such as the user's personal data. On the other hand, the floppy disk, which is a very inexpensive alternative, does not allow data transfer between similar devices without any intervention of a computer, as it requires a particular type of computer to be able to access the data, which is typically a PC computer running the Windows operating system. Thus, if the user wishes to transfer data from one floppy disk to another, the user must first locate a compatible computer with a compatible operating system, which would support the data exchange by copying the data first to its memory (or hard disk) and then copying the data onto the other floppy drive.

SUMMARY OF THE INVENTION

The background art does not teach or suggest a memory storage device which has active functions apart from passively storing data. Also, the background art does not teach or suggest a memory storage device which can transfer data directly to another such storage device through a simplified device interface, without first transferring the data to a computer.

The present invention overcomes these deficiencies of the background art, by providing a device, a method and a system for portable data storage and transfer through a simplified device interface. The operations of the device are restricted, in order to increase the ease of use of the device, and in order to provide certain core functions. These core functions include reading data, writing data and exchanging data with a similar device and/or with an external computer. The device preferably has a limited device interface, which is optionally and more preferably only able to interact with other devices according to the present invention and/or computers. Alternatively, a limited user-device interface is provided, for example in order to permit the user to view and select data for data transfer. According to a preferred embodiment of the present invention, the user is able to set one or more permissions for data exchange, such that requests for data exchange that fulfill such permission(s) cause data to be transferred automatically from the device. For example, if the user has determined that data set "A" would be automatically transferred to another device upon request, and such a request is received from another device according to the present invention and/or from a computer, then data set "A" would be automatically transferred to the requesting device when the device is in a stand alone mode and is turned on. Optionally, such a transfer would occur without additional intervention and/or permission from the user. Alternatively, the user may set the permission(s) such that manual approval must be given by the user through a small display/key that might be optionally part of the device when the device receives such a request.

Hereinafter, the terms "computer" or "computational device" refer to a combination of a particular computer hardware system and a particular software operating system.

For the present invention, a software application could be written in substantially any suitable programming language, which could easily be selected by one of ordinary skill in the art. The programming language chosen should be compatible with the computer by which the software application is executed, and in particularly with the operating system of that computer. Examples of suitable programming languages include, but are not limited to, C, C++ and Java. Furthermore, the functions of the present invention, when described as a series of steps for a method, could be implemented as a series of software instructions for being operated by a data processor, such that the present invention could be implemented as software, firmware or hardware, or a combination thereof.

BRIEF DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE INVENTION

Figure 1:
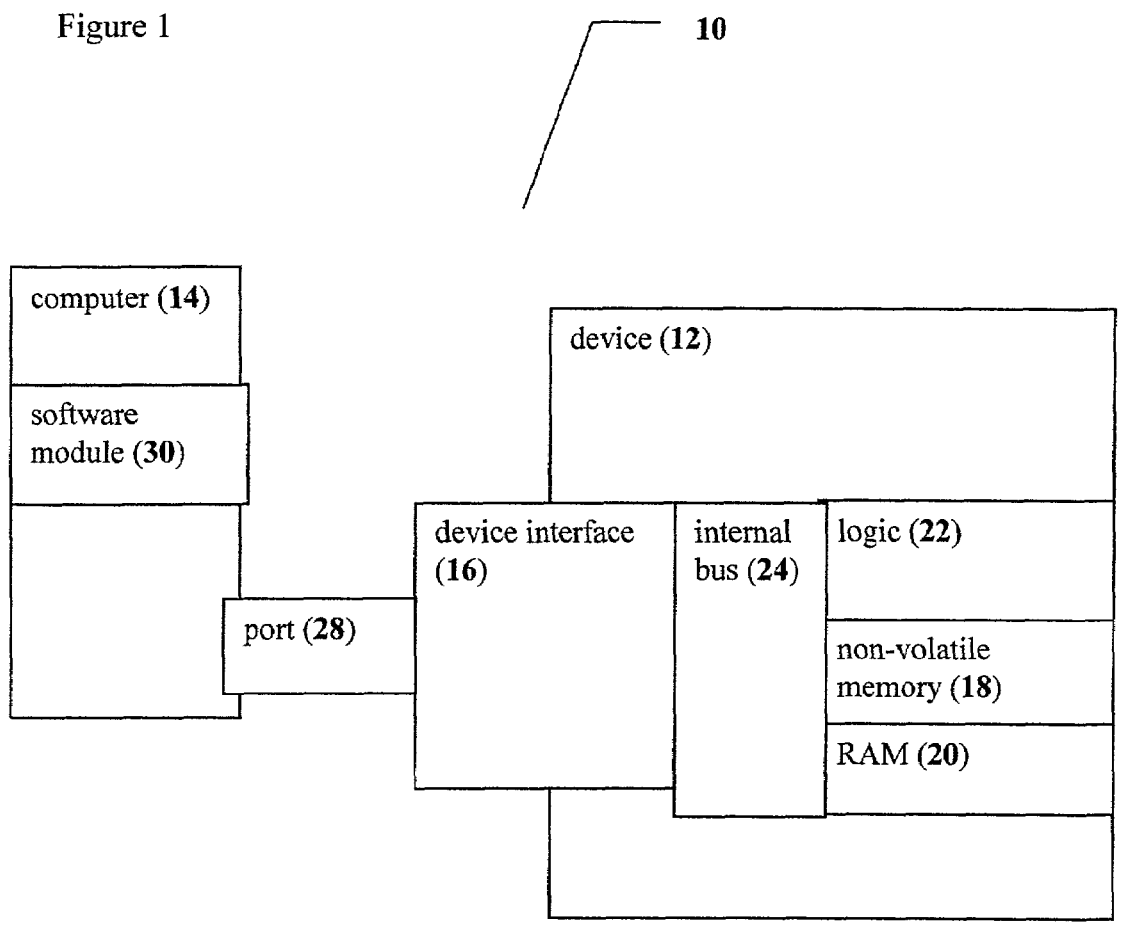
FIG. 1 is a schematic block diagram of an illustrative system and device according to the present invention, in communication with a computer.

The present invention is of a device, a method and a system for portable data storage and transfer through a simplified device interface. The operations of the device are restricted, in order to increase the ease of use of the device, and in order to provide certain core functions. These core functions include reading data, writing data and exchanging data with a similar device and/or with an external computer. The device features a minimal set of hardware components for accomplishing these functions, such as a data processor of some type, a memory storage medium or media, and a data exchange mechanism, which may optionally be an infrared port for example, but is alternatively any type of device interface.

The device according to the present invention also features one or more instructions for performing data transfer, for example in order to be able to operate the data exchange mechanism. These instruction or instructions may optionally be hard-coded, for example by being burnt onto a ROM or any other permanently writable memory device, such that the instruction or instructions are permanently stored in the permanently writable memory device. Alternatively or additionally, the user is not able to alter the instruction or instructions, regardless of the type of storage thereof.

Alternatively, the instructions may optionally be loaded as software. Optionally, an additional software application cannot be downloaded to the device, such that only those applications provided with the device may be used. Preferably, even if additional software applications cannot be downloaded, existing applications can optionally be upgraded.

The device preferably has a limited device interface, which is optionally and more preferably only able to interact with other devices according to the present invention and/or computers. Such a device interface may optionally comprise a data exchange mechanism for communication with another device or a computer. Examples of such exchange mechanisms include but are not limited to, infrared ports, Bluetooth-enabled devices, and cable-based connections, or any other type of device interface.

Alternatively, a limited user-device interface is optionally provided, for example in order to permit the user to view and select data for data transfer. Examples of such a limited interface include, but are not limited to, a display screen (that might for example be part of the device or attached to it), a small keyboard (that might for example be part of the device or attached to it) or a touch-screen, which enables the user to touch the display screen in order to operate a software interface.

According to a preferred embodiment of the present invention, the user is able to set one or more permissions for data exchange, such that requests for data exchange that fulfill such permission(s) cause data to be transferred automatically from the device. For example, if the user has determined that data set "A" would be automatically transferred to another device upon request, and such a request is received from another device according to the present invention and/or from a computer, then data set "A" would be automatically transferred to the requesting device. Optionally, such a transfer would occur without additional intervention and/or permission from the user. Alternatively, the user may set the permission(s) such that manual approval must be given by the user when the device receives such a request. User can also optionally and preferably determine which data set(s) should be received from the other devices by initiating one or more requests for such data.

The device according to the present invention may optionally operate according to a limited instruction set and/or lack an operating system. Preferably, regardless of the configuration of the device according to the present invention, data exchanges or transfers between two such devices are possible.

The principles and operation of a device, a system and a method according to the present invention may be better understood with reference to the drawings and the accompanying description, it being understood that these drawings are given for illustrative purposes only and are not meant to be limiting.

Figure 2:
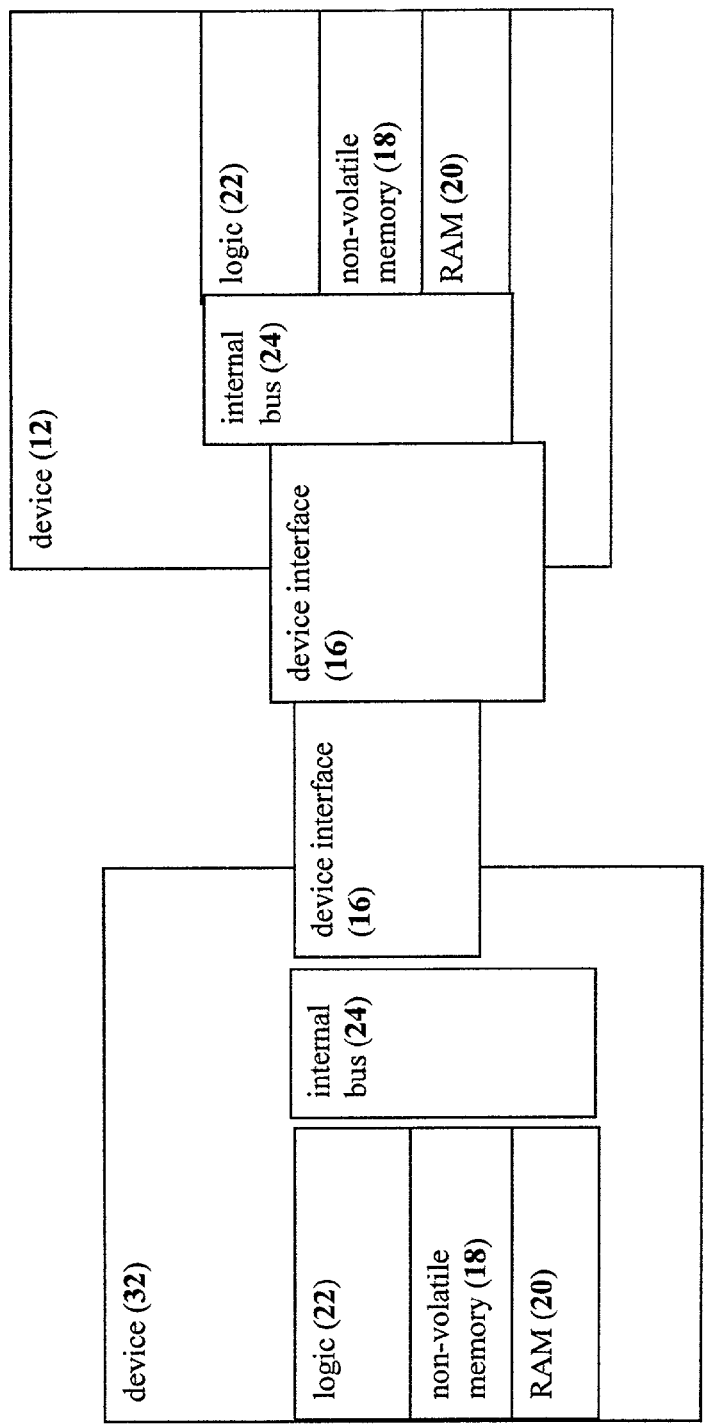
FIG. 2 is a schematic block diagram of two exemplary devices according to the present invention in communication.

Referring now to the drawings, FIG. 1 shows an exemplary system 10 according to the present invention. System 10 features an illustrative device 12 according to the present invention for storing and transferring data. Device 12 is shown as being in communication with a computer 14 for the purposes of explanation and without any intention of being limiting. FIG. 2 shows a second and preferred application of the device of the present invention, in which the device is in direct communication with another such device. It should be noted that optionally device 12 would not necessarily be required or even enabled to connect or otherwise communicate directly with computer 14. Communication through a direct connection between device 12 and computer 14 is optional and preferred.

Turning back to FIG. 1, device 12 features a device interface 16 for accessing data, including both reading and writing data. The data itself is stored in a non-volatile memory 18. Device 12 also preferably features a volatile memory 20, shown as being some type of RAM for the purposes of explanation only and without any intention of being limiting. According to a preferred embodiment of the present invention, non-volatile memory 18 is a flash memory, or at least includes such a flash memory, while volatile memory 20 is any type of RAM which is required for the device operations. Non-limiting examples of such RAM include S-RAM, D-RAM, SD-RAM and any other type of RAM. The flash memory is preferably implemented as any type of flash memory. One optional but non-limiting example of flash memory is a NAND flash memory component.

Device 12 also preferably features a logic 22, which may optionally be a CPU or other type of microprocessor, but alternatively is a plurality of logic gates. Logic 22 is more preferably is implemented as a data processor for performing a plurality of instructions. These instructions are preferably stored in non-volatile memory 18, although alternatively a separate memory could optionally be provided. Such a memory could be any type of non-volatile memory, but could also optionally include instructions which are "hard-coded", for example by being burnt onto a ROM or other hardware memory storage. Logic 22, non-volatile memory 18 and volatile memory 20 all preferably communicate with an internal bus 24. In addition, internal bus 24 is also preferably in communication with device interface 16. Device interface 16 preferably supports communication between device 12 and an external device, such as computer 14. Device interface 16 may optionally include a plurality of instructions for performing "hand-shake" or other communication protocols with computer 14 or any type of external device, as well as instructions for rendering the data, which is stored in non-volatile memory 18, in a format which is understandable by the external device. Optionally and more preferably, device interface 16 supports communication between device 12 and other external devices, although preferably device interface 16 supports communication between device 12 and another such device 12 (not shown; see below).

Device interface 16 may optionally be implemented as any type of communication device, including but not limited to, infrared, Bluetooth-enabled technology and a cable connection. The exact type of technology is not important;

however, device interface 16 should be able to communicate with a corresponding device interface 28 on computer 14. Computer 14 preferably does recognize device 12 as a peripheral device, although such an implementation is not required. Device 12 preferably communicates with computer 14 as a data storage device or as a separate, computer-like device, although device 12 is not a computer. Thus, device 12 optionally and preferably has sufficient instructions and functions for device interface 16 in order for active communication to occur between device 12 and computer 14.

Device 12 can optionally and preferably be attached to computer 14 in order to store or retrieve files to/from computer 14. Computer 14 preferably treats device 12 as a standard data storage peripheral device. Device 12 can optionally and preferably function as a stand alone device while exchanging data according to one or more user definitions (defined when attached to computer 14) with another similar device 32 as shown in FIG. 2.

According to the implementation of FIG. 2, device 12 communicates directly with device 32 (the other device) through the respective device interfaces 16 of device 12 and device 32 for data transfer. Such data transfers are preferably supported by a mechanism for transferring the data between device 12 and device 32, using respective device interfaces 16, such that data transfers occur without passing the data through an additional device.

Device 12 preferably sends one or more files and/or data sets requested by device 32, more preferably as permitted by the user. Device 12 may also send requests for obtaining one or more files and/or data sets, again more preferably according to one or more user definitions. These one or more requests are most preferably fulfilled by device 32 according to the one or more permissions defined therein.

In order for automatic data transfer to occur, device 12 (for example) needs to have at least one instruction for the type of data which is to be transferred automatically. Such instruction(s) could optionally be entered by the user through a software module operated by an external computer, as described with regard to FIG. 1, for example. In any case, at least one type of data, and/or at least one set of data, needs to be marked as being transferable. For example, the user might optionally choose to have the user's name, company affiliation and company contact information transferred automatically from device 12 to device 32, or to any other device according to the present invention. This implementation would be useful at a conference or trade-show for example.

The transfer could optionally automatically occur when devices 12 and 32 are brought into direct physical contact, for example by physically connecting the respective device interfaces 16 of devices 12 and 32, directly or through a cable or other type of physical connector, for example (not shown). Alternatively, the transfer could optionally automatically occur when devices 12 and 32 are brought into a sufficiently close physical area for transfer to occur through a wireless connection, for example if device interface 16 is a wireless port. For the latter implementation, the user(s) would not necessarily need to activate either of devices 12 or 32, as the device according to the present invention could optionally be programmed or instructed to transmit the data upon recognizing the presence of another such device in the same general area. Such recognition could optionally be assisted by the transmission, intermittent or continuous, of a recognition signal by the device according to the present invention.

Figure 3:
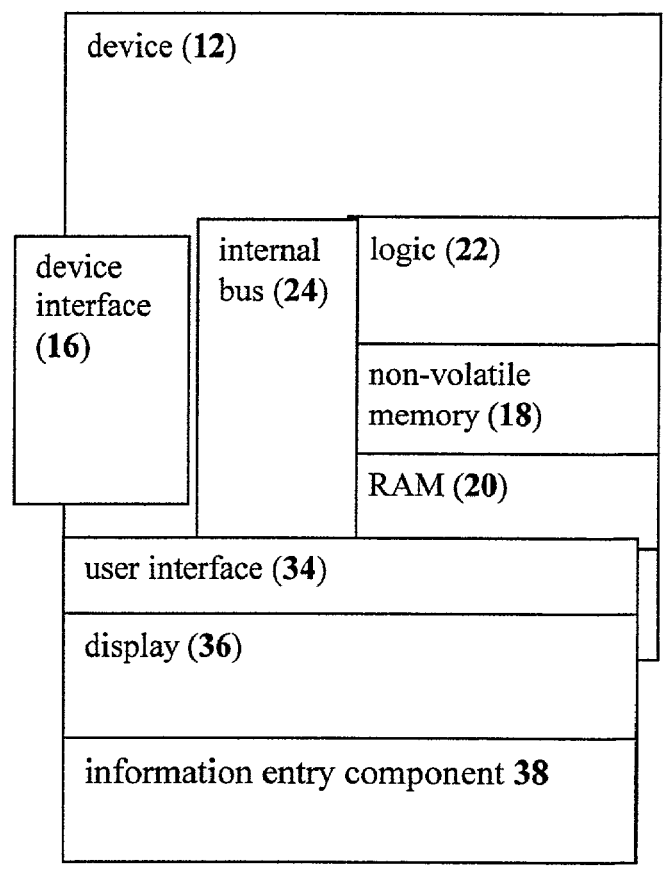
FIG. 3 shows a schematic block diagram of another illustrative embodiment of the device according to the present invention.

FIG. 3 shows a schematic block diagram of another illustrative embodiment of the device according to the present invention, which features an additional user interface 34. User interface 34 preferably enables the user to alter at least one aspect of the instructions stored on device 12, for example on non-volatile memory 18. Preferably, the alterable instructions refer to the different types of data which may optionally be marked for transfer, such that the user could optionally select or deselect particular data, and/or a particular type of data, for transfer, through user interface 34. More preferably, user interface 34 includes a display 36, which enables the user to view the data and/or the instructions being altered.

Optionally, the user could enter new or changed data through user interface 34, although preferably the user is only able to enter altered instructions through user interface 34. In order to assist with such entry of altered instructions, user interface 34 also preferably includes an information entry component 38. More preferably, information entry component 38 includes a keyboard, although additionally or alternatively, information entry component 38 could include a mouse or other pointing device. Alternatively, information entry component 38 could be combined with display 36, for example in the form of a touch-sensitive screen.

Figure 4:
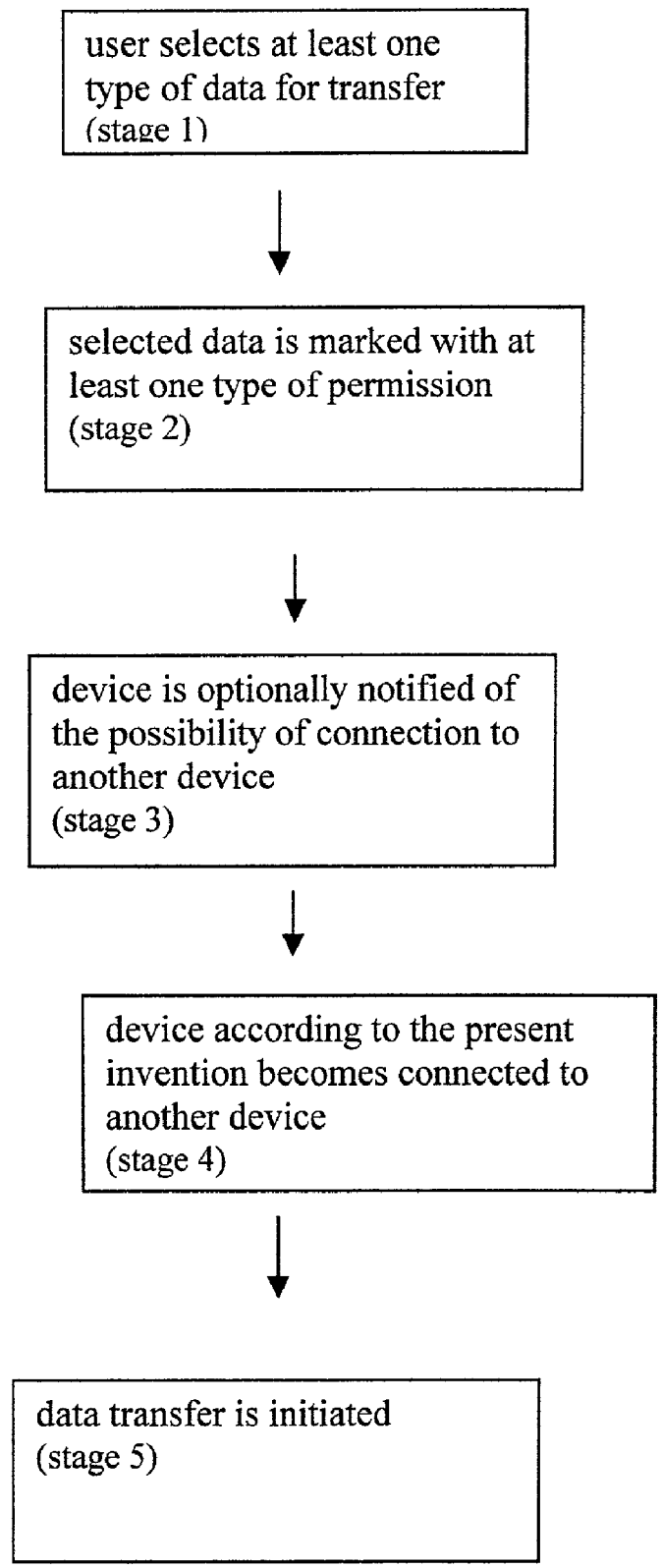
FIG. 4 is a flowchart of an exemplary method for operating the device of any of FIGS. 1–3 according to the present invention.

FIG. 4 is a flowchart of an illustrative method for operation with the devices of any of FIGS. 1–3 according to the present invention. In stage 1, the user selects at least one type of data for transfer from the device according to the present invention. As used herein, "type of data" may also optionally include particular data. The type of data may optionally refer to data of a particular subject matter, such as music or images, for example; data in a particular format, such as JPEG or WAV files for example; specific data files by name or location (such as a sub-folder) for example; or any other type of designation or selection, or a combination thereof. Depending upon the implementation of the device according to the present invention, the data may be selected through the device itself or alternatively through an external computer.

For automatic transfer of data under certain conditions, for example when another device according to the present invention is brought into physical proximity or contact as previously described, preferably the user marks or selects the data for transfer as the data is initially being stored on the device according to the present invention. This optional embodiment is preferred when the device lacks a user interface.

In stage 2, the selected data is marked with at least one type of permission. In stage 3, the device is optionally notified of the possibility of connection to another device, which may be another device according to the present invention for example. Such notification is preferably performed when the device is set for automatic transfer of data upon connection to another device according to the present invention.

In stage 4, the device according to the present invention becomes connected to another device, whether according to the present invention or a computer for example. Such a connection may be a direct physical connection, for example with a cable, or alternatively may be performed with a wireless transceiver, such as an infrared port for example. If the connection is performed automatically, for example upon bringing two devices according to the present invention into the same physical area for communication through a wireless channel, then optionally and preferably the user is able to manually prevent or enable such a connection, for example after the notification of stage 3. Alternatively, if the user must physically connect the two devices, then preferably no further action is required from the user.

In stage 5, data transfer is initiated, with or without further intervention from the user, as previously described. It should be noted that the data transfer may optionally be unidirectional or bi-directional.

According to a preferred embodiment of the present invention, the device is used to assist in locating other individuals having one or more characteristics desired by the user, who are in physical proximity to the user (or at least within a certain distance from the user). For example, the user could optionally program the device to transmit personal information to another device, if that second device indicated that the user of the second device fit certain criteria, such as age, gender, one or more interests, language spoken, and so forth. In order to maintain privacy, optionally the user would only be notified, and the device would only transmit further personal data such as a name, if the basic criteria matched.

According to an optional implementation of the present invention, the user is preferably able to define data and/or file(s) which are permitted for transfer from the device of the user according to the present invention to another such device. When a plurality of devices according to the present invention interact, more preferably in a stand alone mode, each such device preferably transfers the data and/or file(s) which are permitted in an exchange, for example in order to be able to exchange personal data.

It will be appreciated that the above descriptions are intended only to serve as examples, and that many other embodiments are possible within the spirit and the scope of the present invention.

What is claimed is:

1. A portable device for device-to-device data transfer, comprising:
   (a) a non-volatile memory for storing the data; and
   (b) a single device interface for enabling the data to be transferred between the portable device and another such portable device;
   wherein operations of both the portable device and said other portable device, with respect to the data, are restricted to data storage and transfer; wherein the portable device is operative to function as a stand alone device while exchanging the data with said other portable device; and wherein said single device interface is a sole interface of the portable device for data exchange between the portable device and any other device.

2. The device of claim 1, wherein the portable device further includes:
   (c) a logic for executing at least one instruction for controlling said transfer of the data.

3. The device of claim 2, wherein said instructions are not alterable by the user.

4. The device of claim 1, wherein communication between the portable device and said other portable device only occurs through said device interfaces.

5. The device of claim 1, wherein the device lacks an operating system.

6. The device of claim 2, wherein each said portable device further includes an additional memory component for storing said at least one instruction, wherein said logic is a microprocessor.

7. The device of claim 2, wherein said logic is a microprocessor and wherein said at least one instruction is stored on said non-volatile memory.

8. The device of claim 1, wherein the portable device does not feature a user interface for communicating directly with a user.

9. The device of claim 1, wherein said device interface includes a physical connector to another communication port.

10. The device of claim 1, wherein said non-volatile memory is a flash memory.

11. The device of claim 1, further comprising a volatile memory component selected from the group consisting of RAM, SD-RAM, S-RAM and DRAM.

12. The device of claim 1, wherein both the portable device and said other portable device are operative to function as stand alone devices while exchanging data.

13. The device of claim 1, wherein said single device interface is for enabling the data to be transferred directly between the portable device and said other such portable device.

14. A system for data storage for a user, the system comprising a plurality of portable devices, each of said portable devices including:
   (a) a non-volatile memory for storing the data; and
   (b) a single device interface for enabling the data to be transferred directly between another one of said portable devices and said each portable device;
   wherein operations of said portable devices with respect to the data are restricted to data storage and transfer; wherein said portable devices are operative to function as stand alone devices while exchanging data; and wherein, for each said portable device, said single device interface is a sole interface of said each portable device for data exchange between said each portable device and any other device.

* * * * *